United States Patent [19]
Cheng et al.

[11] Patent Number: 4,979,174
[45] Date of Patent: Dec. 18, 1990

[54] ERROR CORRECTION AND DETECTION APPARATUS AND METHOD

[75] Inventors: Ying Cheng, Middletown; Subrahmanyam Dravida, Toms River, both of N.J.

[73] Assignee: AT&T Bell Laboratories, Murray Hill, N.J.

[21] Appl. No.: 291,900

[22] Filed: Dec. 29, 1988

[51] Int. Cl.$^5$ .............................................. G06F 11/10
[52] U.S. Cl. ..................................................... 371/41
[58] Field of Search ........................ 371/38.1, 41, 40.1

[56] References Cited

U.S. PATENT DOCUMENTS

| | | | |
|---|---|---|---|
| 3,078,443 | 2/1963 | Rose | 371/41 |
| 4,047,151 | 9/1977 | Rudbeck et al. | 371/41 |
| 4,336,611 | 6/1982 | Bernhardt et al. | 371/40.1 |
| 4,397,022 | 8/1983 | Weng et al. | 371/41 |
| 4,410,988 | 10/1983 | Suelflow et al. | 371/40.1 |
| 4,592,054 | 5/1986 | Namekawa et al. | 371/38.1 |
| 4,701,923 | 10/1987 | Fukasawa et al. | 371/41 |
| 4,703,486 | 10/1987 | Bemis | 371/41 |

Primary Examiner—Charles E. Atkinson
Attorney, Agent, or Firm—John A. Caccuro

[57] ABSTRACT

A decoder is arranged to operate as a single-bit error correction circuit (ECC) and as a multiple-bit error detection circuit (EDC). The decoder starts and remains in the ECC state as long as no errors are detected in a received data message. When an error is detected or corrected in a received data message, the decoder switches to the EDC state where it remains as long as errors are detected in the received data message. When no errors are detected in the received data message, the decoder switches back to the ECC state. In a generalized multistate decoder, switching occurs from one state to another state, each state having a different error correcting capability, in response to a predetermined number of errors corrected or detected in the received data.

19 Claims, 5 Drawing Sheets

FIG. 5 CRC FOR ERROR CORRECTION
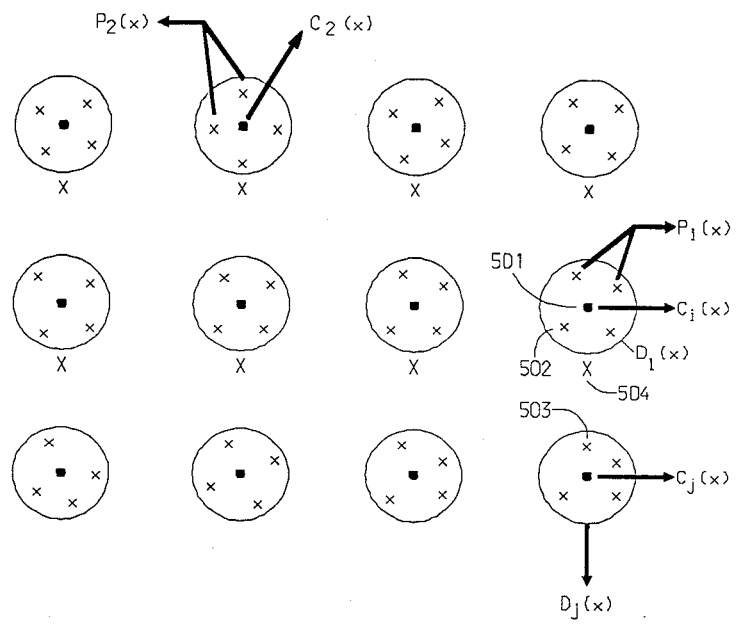
FIG. 6 CRC ENCODER FOR POLYNOMIAL $x^8 + x^2 + x + 1$
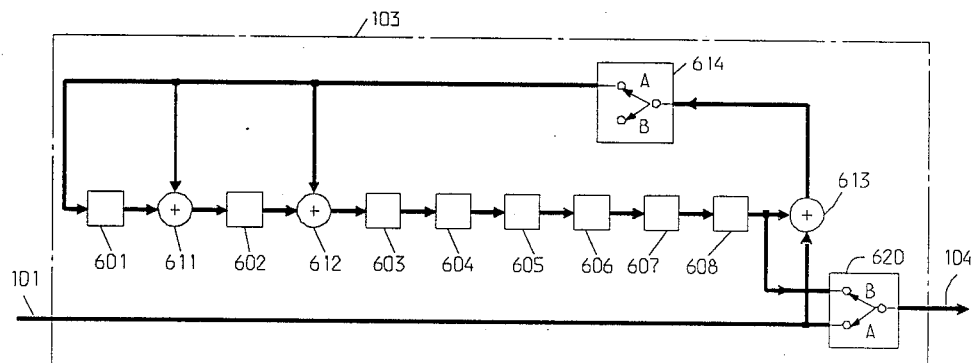

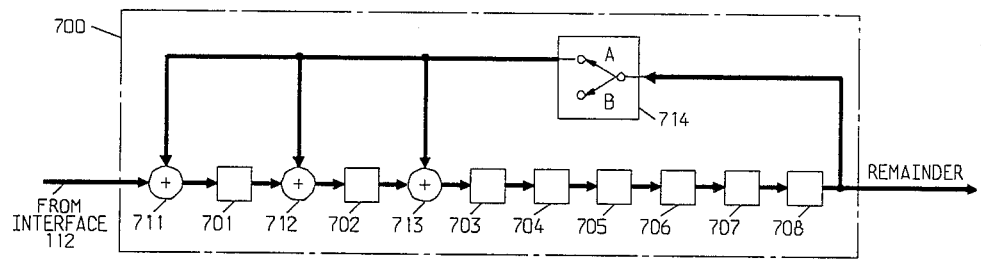
FIG. 7 SYNDROME CIRCUIT FOR POLYNOMIAL $x^8 + x^2 + x + 1$
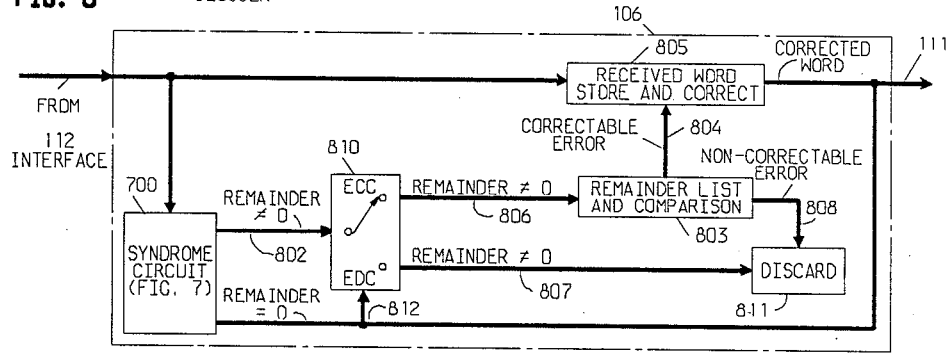
FIG. 8 DECODER
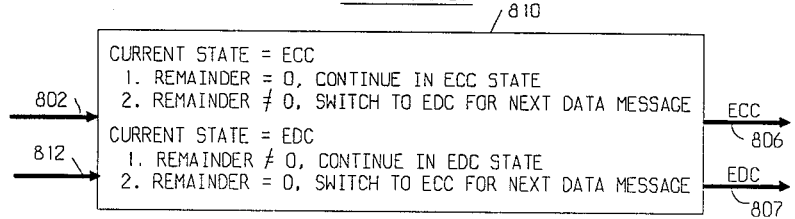
FIG. 9 CONTROL UNIT
```
CURRENT STATE = ECC
  1. REMAINDER = 0, CONTINUE IN ECC STATE
  2. REMAINDER ≠ 0, SWITCH TO EDC FOR NEXT DATA MESSAGE
CURRENT STATE = EDC
  1. REMAINDER ≠ 0, CONTINUE IN EDC STATE
  2. REMAINDER = 0, SWITCH TO ECC FOR NEXT DATA MESSAGE
```
NOTE: REMAINDER = 0 CONVEYED BY 812
REMAINDER ≠ 0 CONVEYED BY 802

ERROR CORRECTION AND DETECTION APPARATUS AND METHOD

TECHNICAL FIELD

This invention relates to data transmission system, and, more particularly, to a method and apparatus for detecting and correcting single and multiple-bit errors.

BACKGROUND OF THE INVENTION

In data communication systems, data transmissions may be corrupted by noise or by other unwanted interference, resulting in data errors. In fiber optic transmission systems, in particular, there are two types of errors: random and burst. The random errors may occur due to noise or a variety of other sources. The burst errors, a large number errors of which occur in a very short period of time (typically 20 to 40 milliseconds (ms)) typically are caused by the occurrence of protection switching in the end-to-end transmission system. Protection switching occurs when a failed repeater in a transmission line causes data to be switched to a protection line.

To facilitate the detection and correction of errors, data is typically encoded using well-known error detecting codes, e.g., cyclic redundancy check (CRC), Hamming, etc. which append an error checking sequence to the data. In many fiber optic systems, the size of error checking sequence is limited to one or two bytes. However, depending on the size of the data word, one or two bytes of error checking may not be sufficient to correct multiple-bit data errors. Using more than one or two bytes of error checking may significantly reduce the information transmission rate of the system. For the above reasons, one or two bytes of error checking typically is used for single-bit error correction schemes. However, while single-bit random error correction schemes are possible using a 1 or 2-byte error checking sequence, these schemes exhibit a greatly reduced level of multiple-bit (burst) error detection power.

What is desired is an error protection scheme for use with data transmission systems which have random and burst error characteristics, and which can correct single-bit errors without sacrificing the capability for detection of multiple-bit errors.

SUMMARY OF THE INVENTION

In accordance with the present invention, at least one error in a data transmission is detected and corrected without degradation in the multiple-bit error detection capability. More particularly, a novel decoder including the present invention is switchably operable as an error correction circuit ECC (with at least single-bit error correction and reduced error-detection power), and as an error-detection circuit EDC (with high error-detection power). The decoder initially operates in the ECC state until one or more errors are detected or corrected in the received data, at which time the decoder switches to the EDC state. The decoder remains in the EDC state until no error is detected in the received data, at which time the decoder is switched to the ECC state.

The teaching of the present invention is generalized to a multistate decoder where switching occurs between states, each having different error correcting capabilities, in response to different predetermined number of errors corrected or detected in the received data. In accordance with the present invention, CRC, Hamming, and other codes are used as error correction codes.

BRIEF DESCRIPTION OF THE DRAWING

In the drawing,

FIG. 5 illustrates the error detection capability of the error correction circuit (ECC) of FIG. 1;

FIG. 6 shows a block diagram of the coder of FIG. 1;

FIG. 7 shows a syndrome circuit for use in the receiver of FIG. 1;

FIG. 8 shows an illustrative block diagram of the decoder circuit of FIG. 1;

FIG. 9 shows the control circuit of FIG. 1; and

DETAILED DESCRIPTION

In the following description, each element of each figure has a reference designation associated therewith, the first number of which refers to the figure in which the element is located (e.g., element 101 is located in FIG. 1).

Figure 1:
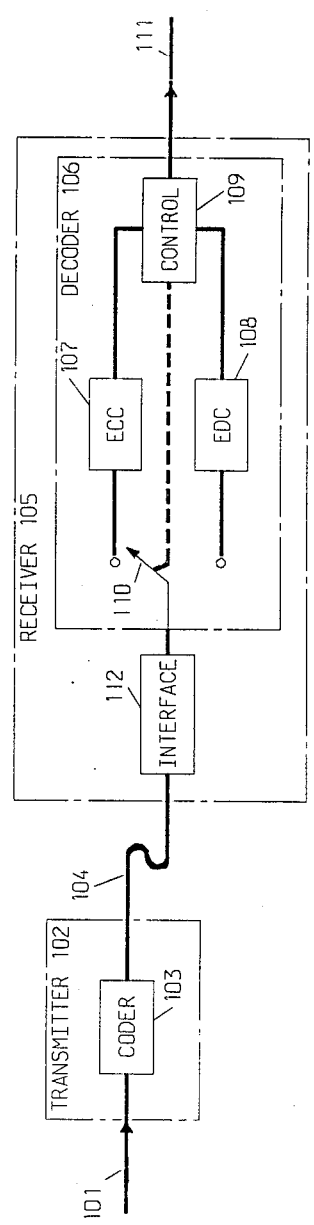
FIG. 1 is a functional block diagram of a data communication system incorporating the present invention.
Figure 2:
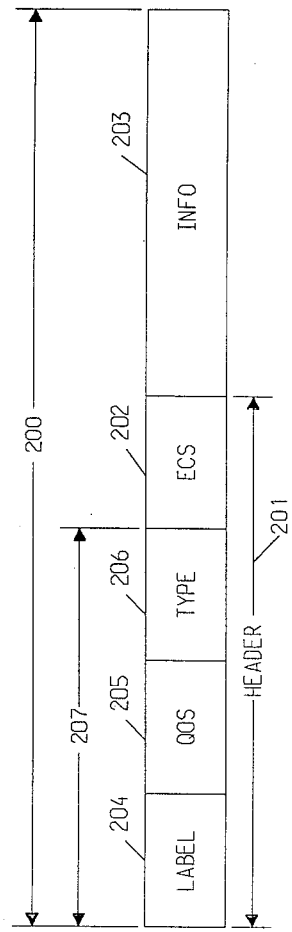
FIG. 2 shows the format of a typical data message.

Shown in FIG. 1 is a functional block diagram of a data communication system in which the present invention is illustratively embodied and FIG. 2 shows an illustrative format of an encoded data message 200. The data message may include a header 201, including an error checking sequence 202, and an information section 203. The error checking sequence 202 is used to verify error-free transmission of the data portion 207 of header 201. In one application, described below, the data portion 207 of header 201 includes Label, (QOS) Quality of Services and Type data fields, 204–206, respectively. The header 201 and the information section 203 are received over lead 101 and the error correction sequence 202 is generated from the data portion 207 of header 201 by a coder 103 of transmitter 102.

In certain data transmission systems (e.g., voice and video systems) misdelivery of data messages (caused by errors in header 201) is more damaging than the correct delivery of erroneous messages (errors in the information 203). When a burst error occurs, thousands of headers could be affected, causing many message to be misdelivered. The misdelivery of messages to unintended destinations could cause buffer overflows and processing bottlenecks.

The particular error checking sequence 202 can be any of a variety of well-known codes, including a CRC code or a Hamming code. For relatively short length headers, the required coder and decoder circuitry is less complicated using a CRC sequence rather than using a Hamming sequence. Furthermore, for short length headers, error correction capability can be implemented using short table look-ups. On the other hand, for longer length headers, the coder and decoder circuitry is less complicated using a Hamming sequence rather than using a CRC sequence.

For example, for a 24-bit data portion 207 with an appropriate CRC code of 6 bits or greater used as the error checking sequence 202, the decoder 106 can detect all single-and double-bit errors in a header 201 having a data portion 207. These CRC codes can also be used to correct single-bit errors as well as to provide single-and multiple-bit error detection, as will be described in a later section.

In one application, an 8-bit CRC header error check sequence 202 may be used to provide protection for IEEE 802.6 segment headers as well as for broadband ISDN cell headers. The existing IEEE 802.6 and broadband ISDN headers (e.g., 201) have four bytes including two reserved bits (e.g., 206) and seven bits allocated for possible error protection (e.g., 202). If one of the two reserved bits is used as an error correction bit then a total of eight bits (one byte) may be used for a CRC error correction sequence, (i.e, 202) to protect the remaining three bytes of header information which includes Label, QOS, and Type fields, 204–206. Eight check bits enable the use of polynomial $x^8+x^2+x+1$ for encoding. Other CRC-8 polynomials could also be used. This aspect of the present invention will be described in later paragraphs.

With reference again to FIG. 1, data message 200 is sent by transmitter 102 over digital data link or facility 104 to receiver 105. Data link 104 may be a radio or an infrared path, a fiber optic cable, a wire cable, etc. Receiver 105 includes an interface circuit 112 and a decoder 106. The interface circuit 112 may condition e.g., by amplifying, filtering, detecting, etc. the signals received over data link 104 for decoder 106 in a well-known manner. Decoder 106 comprises an error correcting circuit (ECC) 107, an error detecting circuit (EDC) 108, a control circuit 109 and a switch 110. The data messages 200 are outputted from receiver 105, with or without the ECS 202, via lead 111. In case of discarding, no data message is outputted from receiver 105. While the block diagram of the decoder 106 functionally illustrates the operation of the decoder, the particular embodiment of decoder 106 is described in later paragraphs.

Figure 3:
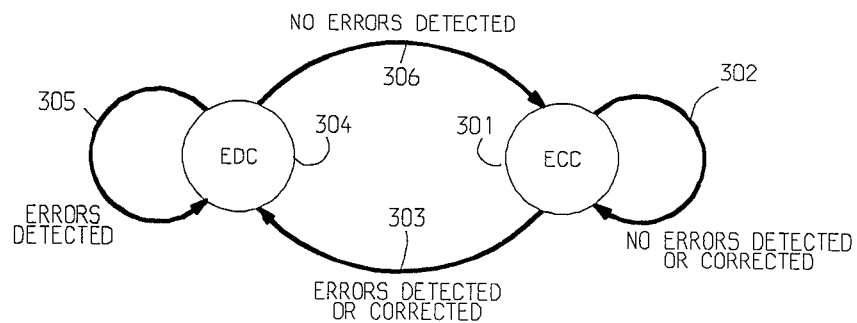
FIG. 3 shows an operational state diagram of the decoder of FIG. 1.

The operation of decoder 106 is best explained with joint reference to FIG. 1 and state diagram FIG. 3. The decoder 106 is initially set in ECC state 301 to perform single-bit error correction and error detection (albeit with lower error detection power) using circuit ECC 107. When no error is detected or corrected as represented by path, 302, the decoder 106 remains in the ECC state 301. When an error is corrected or detected as represented by path, 303, control circuit 109 causes switch 110 of decoder 106 to switch to circuit EDC 108. In FIG. 3, this is illustrated by EDC state 304. The decoder 106 remains in the high error detection mode, i.e., EDC state 304, as long as errors are detected in received data messages, as indicated by path 305. Immediately after encountering a received data message without an error, the decoder 106 switches back into the ECC state 301 via path 306.

Figure 4:
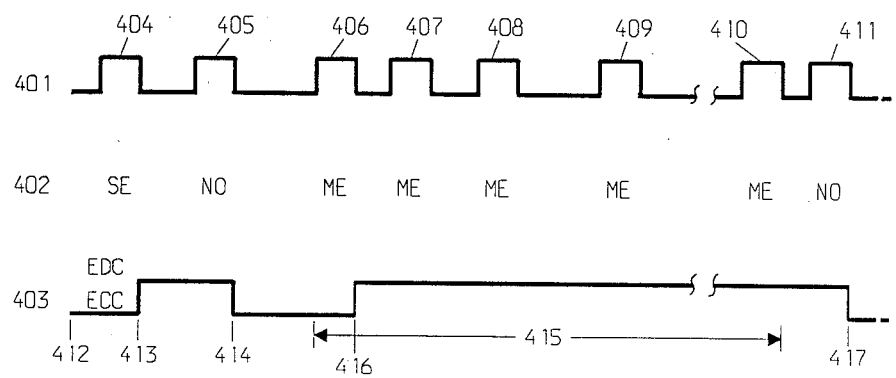
FIG. 4 shows the operating state of the decoder during the reception of various data messages.

With reference to FIG. 4, we illustrate the operation of decoder 106. FIG. 4 illustrates on line 401 a stream of received data words or messages 404–411. Line 402 indicates the presence of a single error (SE), multiple errors (ME) or no errors (NO) in each received data message. Line 403 illustrates the operating state of decoder 106, i.e., ECC or EDC.

Suppose there are no errors on the transmission line for a certain time period, then the decoder is in ECC state at time 412. Thereafter, assume a single-bit random error in data message 404 is received and detected at time 413. The decoder 106 would be in the ECC state until the error is detected and corrected by the decoder at which time 413 the state of the decoder is changed from the ECC state to the EDC state. Since there are no errors in the subsequently received data message 405, the decoder changes back to the ECC state, at time 414, and remains in state ECC until the next erroneous data message 406 is received.

Assume that a group of subsequent data messages, 406–410, are corrupted by multiple errors in each data message or word. Such a condition may occur, for example, during a burst-error condition, like protection switching. With reference to FIG. 1, protection switching may occur when a repeater somewhere in data link 104 has malfunctioned, causing the data messages to be switched to a protection line. During the switching and necessary reframing process that follows, the data link 104 would be essentially open, resulting in a high error rate for a small period of time. Protection switching may last from 20 to 40 ms, during which time the bit error rate is very high. These intervals of high error rates are measured in severely errored seconds (SES) per day.

With joint reference to FIGS. 1 and 4, when the first data message 406 affected by an SES interval is received, at time 416, decoder 106 switches from state ECC to state EDC. This occurs even though the data message 406 might be corrected by circuit ECC 107. The subsequent data messages having multiple data errors, 407–410, are detected by circuit EDC 108 of decoder 106. Because probability of the circuit EDC 108 not detecting an error is very low compared to that of circuit ECC 107, it is desirable to have the decoder 106 in the EDC state during a burst-error condition. Therefore, decoder 106 remains in the EDC state until an error-free data message 411 is received, at which time 417 decoder 106 switches to the ECC state. The probability that a transmission facility or link 104 which is hit by an SES has no errors is extremely small.

In summary, decoder 106 uses the high error detection power of the EDC state when the data link 104 is in a burst-error condition and uses the lower error detection power and single error correction capability of the ECC state during normal error-free state of data link 104. During random error conditions of data link 104, decoder 106 switches from the ECC state to the EDC state in response to the random error and then switches back to the ECC state when error-free conditions resume.

By way of example, consider a 32 bit header 201 of FIG. 2 which uses an 8-bit CRC code as error correction sequence 202. As previously noted, the ECC state does single-bit error correction and also multiple-bit error detection. The error detection capability in the ECC state is somewhat reduced—the probability of non-detection or wrong correction for multiple-errors is 33/256. In the EDC state, the probability that errors will not be detected is 1/256. These probabilities are explained further in the next section.

CRC for Error Protection

A CRC code is a polynomial code in the sense that bit strings are treated as representations of polynomials with coefficients of 0 and 1 only. An n-bit message is regarded as the coefficient list for a polynomial with n terms, ranging from $x^{n-1}$ to $x^0$. Polynomial arithmetic is done modulo 2, according to the rules of algebraic field theory. Hence, both addition and subtraction functions are identical to exclusive-or circuit operations.

In the following, we define the length of headers including the CRC field to be n (n=32 in our illustrative header 201) and denote the generator polynomial by G(x). Assume that the degree of G(x) is r (where r is the number of check bits, r=8 in ECS 208 of header 201). By the definition of CRC code, a received polynomial P(x) (i.e., data message) is detected as incorrect if and only if G(x) does not divide P(x). If remainder $R(x) \neq 0$ the remainder obtained when P(x) is divided by G(x), then P(x) is declared incorrect. However, even if R(x)=0, CRC only guarantees that P(x) is a legal polynomial without indicating whether it is the correct message sent. This implies that CRC could fail to detect errors in P(x) only if R(x)=0. There are $2^{n-r}$ polynomials with R(x)=0. Among them, exactly one is the correct polynomial sent. Therefore, if all possible messages appear equally likely, as during the occurrence of an SES, then the probability of an incorrect polynomial being accepted as valid is $(2^{n-r}-1)/(2^n) \approx \frac{1}{2^r}$. This illustrates the strength of the error detecting capability of the CRC code. This low probability of not detecting an error ($\frac{1}{2^r}$) is utilized in circuit EDC 108 of decoder 106.

A very important feature of CRC codes is that a polynomial code with r check bits will detect all burst errors of length less than or equal to r. This property is very valuable when line encoding is employed, since random errors on the transmission line will give rise to short burst errors.

For small fixed length headers, CRC codes can be used to perform single-bit error correction as well. We next analyze the CRC code with single-bit error-correcting capability. A necessary and sufficient condition for a linear block code to be able to correct single-bit errors is that the minimum Hamming weight (number of non-zero bits) of non-zero codewords is at least 3. It is known that, if x+1 divides the generator polynomial G(x) and G(x) does not divide x and $x^k+1$ for any k up to n, then the Hamming weights of non-zero legal polynomials are at least 3. This provides a method for finding the generator polynomial of a CRC code which can correct single errors. The following is a list of examples of generator polynomials for CRC codes with the capability of correcting single errors for n<64.

$$CRC-6 = x^6 + x^5 + 1$$

$$CRC-7 = x^7 + x^6 + x^2 + 1$$

$$CRC-8 = x^8 + x^2 + x + 1$$

$$CRC-9 = x^9 + x^6 + x + 1$$

$$CRC-10 = x^{10} + x^6 + x + 1$$

When the CRC code is used to correct single errors, a received polynomial P(x) will be classified as one particular legal polynomial if its Hamming distance is 0 or 1 from the legal polynomial. In FIG. 5, each dot (e.g., 501) represents a valid or legal polynomial $C_i(x)$ and each x (e.g., 502) represents a possible received data word. Each disk $D_i$ is centered at a legal polynomial $C_i(x)$. That is, $P_i(x) = C_i(x) + E(x)$ where E(x) is the error polynomial and contains exactly one non-zero coefficient. There are $2^{n-r}$ disks and each disk contains n+1 polynomials. A received polynomial $P_i(x)$ is classified as the legal polynomial $C_i(x)$ when $P_i(x)$ is contained within $D_i$ (i.e., any of the x's shown within disk $D_2(x)$). However, the original polynomial sent could be $C_j$ (e.g., 503) but be corrected to $C_i(x)$ where $j \neq i$. This implies that the probability that an incorrect polynomial is accepted, possibly with correction, as valid is $$\frac{2^{n-r}(n+1) - (n+1)}{2^n} \approx \frac{n+1}{2^r}.$$

If a received polynomial P(x) does not fall within one of the disks (e.g., 504) then it is merely detected, but not corrected, by the decoder at the receiver.

Coding-Decoding Scheme

Hardware implementation of CRC coding schemes are well known; for example, see Shu Lin and D. J. Costello, Jr., *Error Control Coding: Fundamentals and Applications*, Prentice-Hall, 1983. Shown in FIG. 6 is one embodiment of a CRC coder (103 of FIG. 1) using shift registers (601–608) and exclusing-or gates (611–613) and gate 614. Gate 614 operates to connect the CRC code generating circuit to the input lead 101 only during the time A when input lead 101 is connected to facility 104 by gate 620. That is, during time A the data portion (207 of FIG. 2) of the header (201 of FIG. 2) is connected to facility 104 and gate 614. At time B, gate 620 causes the ECS or parity check bits (202 of FIG. 2) generated by CRC encoder 103 to be outputted to facility 104. During time B, gate 614 is open.

The CRC encoder or coder shown in FIG. 6 illustratively uses the polynomial $x^8 + x^2 + x + 1$. This generator polynomial has been chosen because it has the least number of non-zero coefficients of all the eighth-degree generator polynomials that can be used to correct single-bit errors and detect multiple-bit errors. Since an exclusive-or gate is used to implement each non-zero coefficient the CRC coder has the least number of exclusive-or gates (612–613) for implementing an eight-degree generator polynomial.

The operation of coder (103 of FIG. 1) generates a header (201 of FIG. 2) with an error correction sequence ECS (202 of FIG. 2). Thereafter, in a straight forward manner transmitter 102 outputs the information section (203 of FIG. 2).

While the coder shown in FIG. 6 is implemented to handle data messages a single bit at a time, the coder could be implemented to handle groups of bits at a time (e.g., byte-by-byte). Bit-at-a-time operation offers simplicity of design while byte-at-a-time offers enhanced speed of operation. Such a byte-by-byte implementation is more readily adapted to microprocessor implementation. In a byte-by-byte serial implementation eight bits at a time are handled in parallel in a well-known manner to generate the error checking code. See, for example, Dilip V. Sarwate, "Computation of Cyclic Redundancy Checks Via Table Look-up," *Communications of the ACM*, Vol. 31, No. 8, August 1988, pp. 1008-1013.

One embodiment of a syndrome circuit utilized at the receiver for decoding the generator polynomial $x^8 + x^2 + x + 1$ is shown in FIG. 7. The coefficients of the remainder polynomial form the syndrome. The syndrome circuit 700 includes shift registers 701–708, exclusive-or gates (711–713), and gate 714. The received bits of the data portion 207 of header 201, after conditioning by interface 112 of FIG. 1, are shifted into the register from the left end. The data portion 207 bits are shifted into the syndrome circuit 700 with all stages initially set to 0. As soon as the entire data portion 207 of the received word is shifted into the syndrome circuit, the contents in the shift registers 701–708 constitute the syndrome. This syndrome circuit is the "Error Detection Circuit", EDC 108 of FIG. 1. Once the data portion 207 bits have been passed into the syndrome circuit, then if any of the shift-registers is also non-zero, the remainder is also non-zero. This indicates that an error has been detected. Note, with reference jointly to FIGS. 2 and 7, gate 714 remains in position A only while the data portion 207 of the received word 200 is being received. Gate 714 is in position B when the ECS 202 and information 203 bits are being received.

An illustrative overall block diagram embodiment of decoder circuit 106 is shown in FIG. 8 and is implemented using well-known circuits. The decoder 106 includes the above-described a syndrome circuit 700, a control unit 810, a remainder list and comparison circuit 803, a received word store and correct circuit 805 and a discard circuit 811.

Illustratively, the ECC circuit (107 of FIG. 1) includes the syndrome circuit remainder list and comparison circuit 803 and received word store and correct circuit 805. Illustratively, the EDC (108 of FIG. 1) includes the syndrome circuit 700.

The conditioned receive word outputted from interface 112 is connected to the received word store and correct circuit 805 and to syndrome circuit 700. The remainder status (i.e., zero or non-zero) from syndrome circuit 700 is outputted to control unit 810 via lead 802 and lead 812. If the remainder is zero 812, indicating no detected errors, the received word is then outputted on lead 111. If the remainder is non zero the received word may either be corrected or discarded depending on the state of control unit 810.

The control block and switch functionally shown as 109 and 110, respectively, in FIG. 1 are embodied in control unit 810 in FIG. 8. With reference to FIG. 8 and FIG. 9, the operation of the control unit 810 is described. When the decoder is in the EDC state and an error is detected (remainder 802 from syndrome circuit 700 is non-zero, 807), then the received word is outputted on lead 807 and dropped by discard circuit 811. When the decoder is in the ECC state and the remainder is non-zero, 806, but matches one of the patterns stored in "Remainder List", of circuit 803, then the received word has a correctable error 804 and circuit 805 corrects the erroneous bit. If the remainder does not match any of the stored patterns in circuit 803, then the received word is uncorrectable 808 and is dropped by discard circuit 811. Note, the discard circuit 811 drops not only the errored header (201) but also the corresponding information field (203) as well.

In the block labeled Remainder List and Comparison Circuit 803, the remainders corresponding to errors in different bit positions of the header are precomputed and stored. When a remainder signal 806 from the syndrome circuit 700 is fed into the Remainder List and Comparison Circuit 803 the output 804 indicates the bit position of the header that is in error. Then the corresponding bit in header is inverted to the correct binary state by correction circuit 805, resulting in a corrected word output over lead 111. The comparison of remainder 802 with remainder list in 803 is implemented in a well-known manner in combinational logic at very high speeds. This implementation is no more complex than implementing a CRC-check and can be done in real-time.

The control unit 810 shown in FIG. 8 is basically a switch having the switching characteristics shown in FIG. 9. The following description jointly references FIGS. 8 and 9. When the decoder (106 of FIG. 8) is in the ECC state and the remainder 812 from syndrome circuit 700 is zero, the decoder continues in the ECC state. However, when the decoder is in the ECC state and the remainder 802 is non-zero, the control unit switches the next incoming segment header to the EDC state, to process the next header. When the decoder is in the EDC state and the remainder is non-zero, 802, the control unit 810 keeps the decoder in the EDC state for processing the next incoming header. However, when the decoder is in the EDC state and the remainder is zero, 812, the control unit 810 switches the next incoming header to the ECC state.

The teachings of the present invention can be generalized to implement a multistate decoder. The multiple decoder states could include error detection, single-bit correction, two-bit correction and so on. Shown in FIG. 10 is an operational state diagram of a generalized multistate decoder having N error correction states or circuits (i.e., 1001, 1009 through 1110) and one error detection state or circuit (i.e., 1004).

One application of a multistate decoder is for communications from space probes which are transmitted over very long distances. Requesting retransmission in such applications, involves tremendous delay as well as large storage capacity in the space probe. Therefore in such an application, error correcting codes are typically employed. Appropriately chosen error correcting codes such as BCH codes are used in this application.

For example, a BCH code can be designed to correct 3 or fewer errors in every block of information bits. A multistate decoder for correcting 3 errors may operate as shown in FIG. 10, where N=3. Each of the ECC circuits for implementing states (1001, 1009–1010), and EDC circuit (for implementing state 1004) would be switchably connected to the received data input in a manner equivalent to that shown in decoder 106 of FIG. 1.

Figure 10:
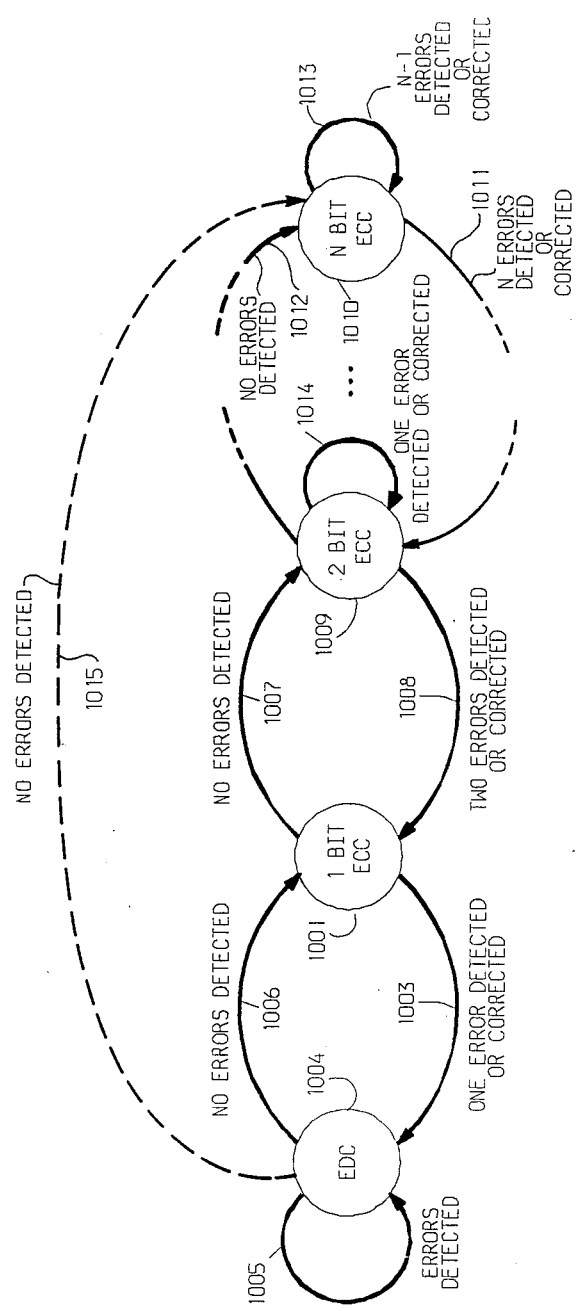
FIG. 10 shows an operational state diagram of a generalized multistate decoder having N error correction states.

Assume the multistate decoder of FIG. 10 is initially in the 3 bit ECC state 1110. When 3 bit errors are corrected in the received data message by the multistate decoder of FIG. 10, there is a chance that the received data message has been miscorrected. That is, when a received data message has been corrected the multistate decoder does not know whether 3 bits or less contained errors or whether greater than 3 bits contained errors. If less than 3 bits contained errors then the corrected word will be interpreted correctly and the transmitted data message would then be correctly delivered to the proper destination. However, if more than 3 bits contained errors, then the multistate decoder does not have the capability to correct all of the errors and, consequently, would incorrectly select the data message which is most likely to be the transmitted data message. This is a miscorrection and the received data message will then probably be misdelivered. With reference to FIG. 5, this result is similar to a data message $C_j(x)$ being sent, being corrected by the data path and received as data message 502, and being corrected to $C_i(x)$, resulting in a miscorrection.

Since three or more errors are more likely to occur during a burst error condition than during a random error condition, more misdelivery of data messages are likely to occur during burst error conditions as opposed to random error conditions. As previously discussed, in the single bit error correcting embodiment described in FIG. 3, it is desirable to switch from the higher error correcting states (e.g., 1009) to a lower error correcting state (e.g., 1001) or error detection state (e.g., 1004) to obtain an improved error detection power during burst error conditions. Thus, in FIG. 10 error detection power (i.e., the probability of detecting errors) decreases from EDC state 1004 up through N bit ECC state 1010. With reference to FIG. 10, when multistate decoder corrects or detects 3 bit errors, it switches from the 3 bit ECC state 1010 to the 2 bit ECC state 1009 via path 1011. However, if only 1 or 2 bit errors are corrected or no errors are detected then the multistate decoder remains in 3 bit ECC state 1109 via path 1013.

In accordance with the present invention, the multistate decoder can be made to switch from the 3 bit ECC state 1010 to the 2 bit ECC state 1009 for any predetermined condition of error correction and detection possibilities. Thus, for example, if desirable, the multistate decoder can switch from 3 bit ECC state 1010 to 2 bit ECC state 1009 when 2 bit or even 1 bit errors are corrected.

Returning to our example, we assume that no switching occurs when the number of errors corrected is less than the error correcting capability of the particular state. Thus, for the 3 bit state 1010 (i.e., N=3) no state switching occurs (see path 1013) when no errors are detected or when only 1 or 2 bit errors are corrected. However, when a 3 bit error is corrected the multistate decoder switches via path 1011 to the 2 bit state 1009. When the next data message is received, if it contains no errors then multi-state decoder switches from the 2 bit ECC state to the 3 bit ECC state 1010 via path 1012. If, however, only one error occurs then the multistate decoder remains in the 2 bit ECC state 1010 via path 1014. If two errors are corrected or detected then the multistate decoder switches to the 1 bit ECC state 1001 via path 1008.

Once in the 1 bit ECC state 1001 if no errors are detected the multistate decoder switches via path 1007 to the 2 bit ECC state 1009. If one error is corrected or detected then the multistate decoder switches to the EDC state 1004 via path 1003. The multistate decoder remains in the EDC state 1004, via path 1009, as long as errors are detected, but switches to the 1 bit ECC state 1001, via path 1006, if no errors are detected.

Note, in an alternative embodiment, the condition for switching the multistate decoder to a higher error correcting state (i.e., 1 bit ECC state 1001 to 2 bit ECC state 1014) may utilize other than a "no errors detected" condition. Thus, for example, the condition utilized could be when the number of errors detected or corrected is less than the error correcting capability in the existing state then the decoder switches to the next higher error correcting state.

Moreover, once at the EDC state 1004, a no error condition could switch the multistate decoder to any other error correcting state (e.g., state 1013 using path 1015). Thus it should be understood that the conditions for switching the state of the decoder up or down is selected dependent upon the communication system, the expected noise condition of the communication path, and performance objectives of the system.

While the present disclosure describes error detection and correction on headers, obviously the present invention can be applied to any part of or to the whole data message unit that requires error protection. Additionally, the error correction code can be coded into the data message rather than being a separate error checking sequence appended to the data message (as shown by 202 of FIG. 2).

The present invention can be implemented using well-known discrete circuits or one or more integrated circuits using silicon bipolar technology, FET technology or other non-silicon technologies (e.g., gallium arsenide). Additionally, the invention could also be implemented using one or more microprocessors.

In some transmission systems, data messages may be encoded to reduce the data transmission rate. When line encoding is used, then potentially single-bit errors may translate into error bursts of length less than or equal to four. There exist codes (e.g., Fire codes) which can be used to correct burst errors but the overhead involved is prohibitive. In such instances, the best that can be done is the detection of error bursts of small length. This problem will be worsened by the possibility of burst errors produced by protection switching. Therefore in transmission systems which use line encoding, it is very important to be able to detect error bursts.

When line encoding is used, the decoder (106 of FIG. 1) can be set permanently in the error detection state EDC and CRC schemes are very effective in detecting small bursts.

In accordance with other aspects of the present invention, the switching control logic (of FIG. 9) can be matched to error mechanisms present in different transmission technologies. For example, digital radio is subject to long fades, where the duration of the fade is long but the error density is not high. In such a case the decoder 106 of FIG. 1 can continue to be in the EDC state until, for example, 10 consecutive messages are error-free.

For non-real time applications (e.g., information received from planetary probes, satellites), the received message can be sent through to both ECC and EDC and, depending upon the error statistics of the medium, a decision can be made whether to accept corrected messages or not.

What has been described is merely illustrative of the application of the principles of the present invention. Other methods and circuits can be implemented by those skilled in the art without departing from the spirit and scope of the present invention.

We claim:

1. Apparatus for receiving input digital data coded using a predetermined error correction code, said apparatus comprising first means capable of correcting a first number of errors in the received data and capable of detecting errors in the received data at a first probability rate;

second means capable of correcting a second number of errors in the received data, which is greater than said first number of errors, and capable of detecting errors in the received data at a second probability rate less than said first probability rate;

means for deriving an error signal from said received data; and control means for applying said received data to said first means, and subsequently in response to said error signal indicating a first predetermined number of corrected errors in said received data, which is less than or equal to said first number, thereafter applying said received data to said second means, and thereafter in response to a subsequent error signal indicating a second predetermined number of corrected errors in said received data, which is less than or equal to said second number and greater than said first number, thereafter again applying said received data to said first means.

2. The apparatus of claim 1 wherein said first predetermined number is equal to zero.

3. The apparatus of claim 2 wherein said second predetermined number is equal to said second number.

4. The apparatus of claim 1 wherein said second predetermined error number is equal to said second number and said control means does not apply said received data to said first means when the number of corrected errors is less than said second number.

5. The apparatus of claim 1 further comprising means for interfacing the apparatus to a digital data link to receive an input signal.

6. A data communication system including a data transmitter and a data receiver connected over a data path, said data transmitter comprising means for generating and transmitting digital data coded using an error correcting code to said receiver; and said receiver comprising means for receiving said digital data; first means capable of correcting a first number of errors in the received data and capable of detecting errors in the received data at a first probability rate; second means capable of correcting a second number of errors in the received data, which is greater than said first number of errors, and capable of detecting errors in the received data at a second probability rate less than said first probability rate; means for deriving an error signal from said received data; and control means for applying said received data to said first means, and subsequently in response to said error signal indicating a first predetermined number of corrected errors in said received data, which is less than or equal to said first number, thereafter applying said received data to said second means, and thereafter in response to a subsequent error signal indicating a second predetermined number of corrected errors in said received data, which is less than or equal to said second number and greater than said first number, thereafter again applying said received data to said first means.

7. A method of operating a data receiver for receiving input digital data coded using a predetermined error correction code, said method comprising the steps of:
(a) deriving an error signal from said received data,
(b) applying said received data to a first correcting step c,
(c) correcting a first number of errors in the receiving data and detecting errors in the received data at a first probability rate;
(d) in response to said error signal indicating a first predetermined number of corrected errors in said received data, which is less than or equal to said first number, applying subsequent-received data to a second correcting step e,
(e) correcting a second number of errors in said subsequent-received data, which is greater than said first number of errors, and detecting errors in said subsequent-received data at a second probability rate less than said first probability rate; and
(f) in response to said error signal indicating that a second predetermined number of corrected errors in said subsequent-received data, which is less than or equal to said second number and greater than said first number, applying newly received data to said first correcting step (c).

8. Apparatus for receiving input digital data coded using an error correction code, said apparatus comprising
error correcting circuit (ECC) means for detecting one or more errors and for correcting a single-bit error in the received data using said error correction code,
error detecting circuit (EDC) means for detecting one or more errors in the received data using said error correction code,
means for deriving an error signal in a predetermined manner from said received data, and
switch means responsive to the absence of an error signal received from said deriving means for switching the detecting of said received data from said EDC means to said ECC means and responsive to the presence of said error signal for switching the detecting of said received data from said ECC means to said EDC means.

9. The apparatus of claim 8 wherein said switch means does not switch from said EDC means to said ECC means in response to an error signal derived in said predetermined manner from said received data and does not switch from said ECC means to said EDC means in response to a no-error signal derived in said predetermined manner from said received data.

10. The apparatus of claim 8 wherein said EDC means includes a syndrome circuit for processing the received data utilizing the same process used to generate said error correction code and generating an error and a no-error signal in response to the received data.

11. The apparatus of claim 10 wherein said syndrome circuit includes means for processing groups of data bits from the received data.

12. The apparatus of claim 8 wherein said ECC means includes a syndrome circuit for processing the received data utilizing the same process used to generate said error correction code and for generating an error and a no-error signal, said error signal representing remainder term after said processing and said no-error signal representing no remainder term after said processing,
remainder list and comparison means for comparing the remainder term with a list of predefined remainder terms to determine a bit position in the received data where an error exists, and
means responsive to a signal indicating the bit position of an error in the received data for inverting the data in said bit position.

13. The apparatus of claim 12 wherein said switch means includes
means for gating the received data for processing by a particular one of said EDC means and said ECC means depending on the existing state of said switch means and said remainder term.

14. The apparatus of claim 8 wherein said error correction code is generated using a CRC code.

15. The apparatus of claim 8 further comprising means for interfacing the apparatus to a digital data link to receive said input digital data.

16. The apparatus of claim 8 wherein said input data includes a header and information bits and wherein said error correction code is generated for said header bits and wherein said ECC means and EDC means perform their respective operations on said header bits.

17. A data communication system including a data transmitter and a data receiver connected over a data path, said data transmitter comprising means for generating a data message including an error correction code and means for transmitting said data message to said receiver, and said receiver comprising means for receiving said data message, an error correcting circuit (ECC) means for detecting one or more errors and correcting a single-bit error in the received data message using said error correction code, an error detecting circuit (EDC) means for detecting one or more errors in the received data message using said error correction code and means for deriving an error signal in a predetermined manner from said received data, and switch means responsive to the absence of an error signal received from said deriving means for switching the detecting of said received data from said EDC means to said ECC means and responsive to the presence of said error signal for switching the detecting of said received data message from said ECC means to said EDC means.

18. A method of operating a data receiver for receiving input digital data coded using an error correction code therein, said method comprising the steps of:

(a) detecting one or more errors and correcting a single-bit error in the received data using an error correcting circuit (ECC) and said error correction code, (b) in response to an error correction or detection signal derived in said detecting step (a), switching said received data from said detecting step (a) to detecting step (c), (c) detecting one or more errors in received data using an error detecting circuit (EDC) and said error correction code, and (d) in response to an absence of an error signal in said detecting step (c), switching said received data to said detecting step (a).

19. A method of operating a data communication system including a data transmitter and a data receiver connected over a data path, said method comprising the steps of:

at said data transmitter generating and transmitting a data message including an error correction code and at said receiver (a) detecting one or more errors and correcting a single-bit error in the received data message using an error correcting circuit (ECC) and said error correction code, (b) in response to an error correction or detection signal derived in said detecting step (a), switching said received data message from said detecting step (a) to detecting step (c), (c) detecting one or more errors in received data using an error detecting circuit (EDC) and said error correction code, and (d) in response to an absence of an error signal in said detecting step (c), switching said received data to said detecting step (a).

* * * * *